(12) United States Patent
Goss et al.

(10) Patent No.: US 8,705,291 B2
(45) Date of Patent: Apr. 22, 2014

(54) SANITIZING A NON-VOLATILE MEMORY THROUGH CHARGE ACCUMULATION

(75) Inventors: Ryan James Goss, Prior Lake, MN (US); David Scott Seekins, Shakopee, MN (US); Navneeth Kankani, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 308 days.

(21) Appl. No.: 13/117,913

(22) Filed: May 27, 2011

(65) Prior Publication Data
US 2012/0300554 A1 Nov. 29, 2012

(51) Int. Cl.
*G11C 11/34* (2006.01)
*G11C 16/04* (2006.01)

(52) U.S. Cl.
USPC ............. 365/185.33; 365/185.26; 365/185.29

(58) Field of Classification Search
USPC .......... 365/185.33, 185.18, 233, 194, 189.12, 365/201, 189.05, 193, 226, 189.08, 230.08, 365/154, 230.06, 185.21, 205, 207, 49, 168, 365/149, 129
See application file for complete search history.

(56) References Cited

U.S. PATENT DOCUMENTS

| | | | |
|---|---|---|---|
| 5,499,296 A | 3/1996 | Micall | |
| 5,832,493 A | 11/1998 | Marshall et al. | |
| 6,904,150 B1 | 6/2005 | Dent | |
| 7,089,350 B2 | 8/2006 | Koren et al. | |
| 7,475,203 B1 | 1/2009 | Petrillo, Jr. et al. | |
| 7,739,315 B2 | 6/2010 | Haga | |
| 2004/0260921 A1 | 12/2004 | Treadwell | |
| 2005/0050342 A1 | 3/2005 | Bolvie et al. | |
| 2006/0005047 A1 | 1/2006 | Lekatsas et al. | |
| 2007/0014160 A1* | 1/2007 | Kobernik et al. | 365/185.23 |
| 2007/0043940 A1 | 2/2007 | Gustave et al. | |
| 2007/0071234 A1 | 3/2007 | Lagrange et al. | |
| 2008/0162937 A1 | 7/2008 | Kohlenberg et al. | |
| 2008/0189485 A1 | 8/2008 | Jung et al. | |
| 2009/0196100 A1 | 8/2009 | Merry, Jr. et al. | |
| 2009/0231926 A1* | 9/2009 | Sarin et al. | 365/185.21 |
| 2010/0229005 A1 | 9/2010 | Herman et al. | |
| 2011/0119538 A1 | 5/2011 | Ipek et al. | |
| 2011/0154060 A1 | 6/2011 | Guyot et al. | |

OTHER PUBLICATIONS

"IEEE P1619.2D16 Draft Standard for Wide-Block Encryption for Shared Storage Media," IEEE Standards Draft, May 2010, pp. i-viii & 1-81, IEEE.

Richard Kissel, et al., "Guidelines for Media Sanitization," Draft NIST Special Publication 800-88 Revision 1, Computer Security Division, Information Technology Laboratory, Sep. 2012, pp. 1-57, National Institute of Standards and Technology, US.

Gordon Hughes, et al., "Tutorial on Disk Drive Data Sanitization," pp. 1-15.

"National Industrial Security Program," Operating Manual, Feb. 2006, DoD 5220.22-M, Department of Defense, US.

* cited by examiner

*Primary Examiner* — Son Dinh
*Assistant Examiner* — Uyen B Tran
(74) *Attorney, Agent, or Firm* — Hall Estill Attorneys at Law (57) ABSTRACT

Method and apparatus for sanitizing a non-volatile memory, such as a flash memory array. In accordance with various embodiments, a memory cell is sanitized by using a write circuit to accumulate charge on a floating gate of the cell to a level such that application of a maximum available read sensing voltage to a control gate of the cell is insufficient to place the cell in a conductive state.

20 Claims, 6 Drawing Sheets

SANITIZING A NON-VOLATILE MEMORY THROUGH CHARGE ACCUMULATION

SUMMARY

Various embodiments of the present invention are generally directed to sanitizing a non-volatile memory, such as a flash memory array.

In accordance with various embodiments, a memory cell is sanitized by using a write circuit to accumulate charge on a floating gate of the cell to a level such that application of a maximum available read sensing voltage to a control gate of the cell is insufficient to place the cell in a conductive state.

These and other features and advantages which characterize the various embodiments of the present invention can be understood in view of the following detailed discussion and the accompanying drawings.

DETAILED DESCRIPTION

The present disclosure generally relates to data security, and more particularly to a method and apparatus for sanitizing a non-volatile memory such as a flash memory array.

Memory devices, such as hard disc drives (HDDs), solid-state drives (SSDs), flash memory "thumb" drives, hybrid devices, multi-memory systems, etc., are used in a wide number of consumer, commercial, governmental and military applications. Data security can be an important consideration with such devices.

It is often desirable that a memory be subjected to a special memory sanitizing operation to ensure that previously stored data in the memory cannot be easily recovered by an unauthorized third party. A number of U.S. Federal and State Regulations require memory devices to be securely erased under certain circumstances, and failure to do so may result in civil and/or criminal penalty. Some well-known governmental standards that set forth various requirements for secure erasure include the NIST 800-88 Enhanced Secure Erase Standard and the DoD 5220 Block Erasure Standard.

These and other standards provide a variety of ways in which data can be sanitized from a memory. In this context, sanitizing (data purging) generally refers to removal of previously stored data from a memory, including stale copies and current versions, in such a way that the programmed data cannot be easily recovered. Such sanitizing may or may not include the use of a special "erasure" operation that is different from a normal data write operation.

In some cases, a non-destructive purging can take place by overwriting existing data a number of consecutive times in order to mask the magnetic, electrical and/or optical signatures of previous storage states. Even when a memory cell has been subjected to multiple writes/erasures, however, a sophisticated and motivated attacker may still be able to use a variety of laboratory techniques to recover the previously stored data from the medium.

Many existing secure erasure techniques can be time and power consuming, and in some cases can significantly reduce the remaining operational life of the memory. Some types of flash memory cells that store data in a multi-level cell (MLC) configuration may be initially limited to a total number of around 5,000 erasure cycles. Thus, conventional secure erase operations that involve numerous repeated erasures may tend to significantly reduce the lifetime of the device, and may not fully secure the device from informational leakage.

Accordingly, various embodiments of the present invention are generally directed to a method and apparatus for carrying out a data sanitizing operation on a memory. As explained below, a fast program data sanitizing operation can be provided in which at least one memory cell in an array is sanitized by using a write circuit to accumulate charge on a floating gate of the cell. Sufficient charge is accumulated such that application of a maximum available read sensing voltage to a control gate of the cell is insufficient to place the cell in a conductive state. In some embodiments, a fast erase data sanitizing operation is further provided that is operable to remove the accumulated charge from the floating gate. This may reduce the ability of a third party attacker to read the cell and discover a previous programmed state from a residual charge signature or other characteristic of the cell.

Figure 1:
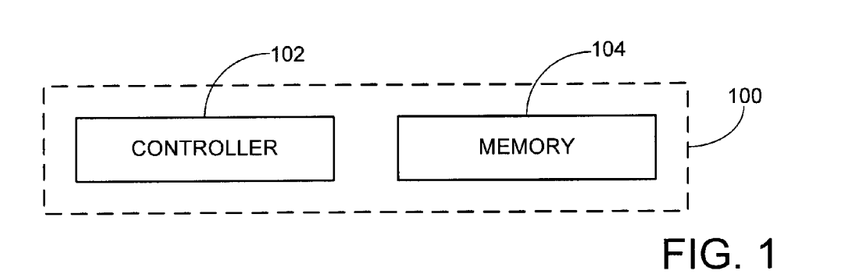
FIG. 1 provides a functional block representation of an exemplary data storage device in accordance with some embodiments.

These and other features and considerations will be discussed beginning with a review of FIG. 1 which generally illustrates an exemplary data storage device 100. The device 100 includes a controller 102 and a memory module 104. The controller 102 provides top level control for the device 100 and may be configured as a programmable processor with associated programming in local memory.

The memory module 104 can be arranged as one or more non-volatile memory elements. While a separate controller 102 is shown in FIG. 1, such is unnecessary as alternative embodiments may incorporate any requisite controller functions directly into the memory module. While not limiting, for purposes of the present discussion it will be contemplated that the data storage device 100 is a solid-state drive (SSD) that utilizes flash memory cells in the memory module 104 to provide a main data store for a host device (not shown).

The host device can be any device that communicates with the storage device 100. For example and not by way of limitation, the storage device may be physically incorporated into the host device, or the storage device may communicate with the host device via a network using any suitable protocol.

Figure 2:
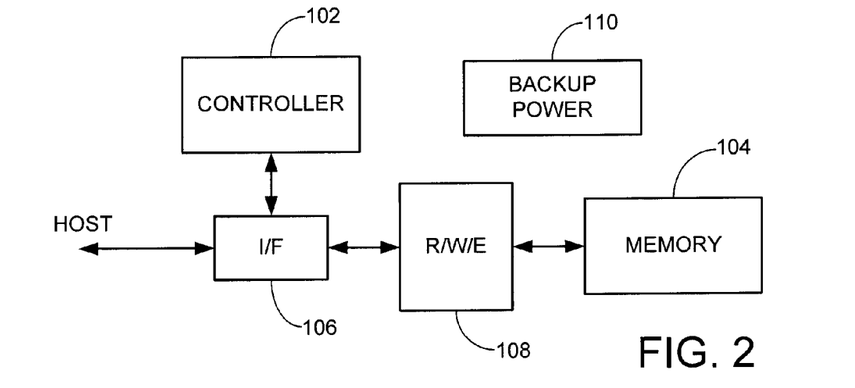
FIG. 2 is a detailed functional representation of the storage device of FIG. 1

FIG. 2 shows the device 100 in accordance with some embodiments. An interface (I/F) circuit 106 can be configured to process I/O commands and data transfers with the host under control of the controller 102. The I/F circuit 106 may include a buffer memory suitable for temporarily storing readback and write back data during transfer operations with the host, as well as control data and programming used by the controller 102.

A read/write/erase (R/W/E) circuit 108 applies the requisite signal processing to effect a data transfer with the memory 104. Such processing may include encoding, serializing, encryption, error correction encoding, and so on. A backup power module 110 can be incorporated into the device to provide standby power for use by the device as discussed below.

Figure 3:
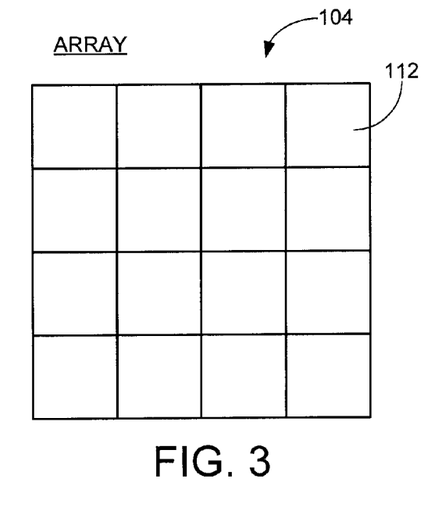
FIG. 3 sets forth a representation of erasure blocks of the memory of FIGS. 1-2.

FIG. 3 shows a portion of the memory array 104 as a grouping of erasure blocks 112. It is contemplated that the memory array 104 may include any number of such blocks, including blocks on different dies, strips, planes, chips, layers and arrays. Each of the erasure blocks 112 may be separately erasable and the controller 102 may track control information for each erasure block, such as a total number of erasures, date stamp information relating to when the various blocks have been allocated, etc.

Overprovisioning techniques may be used by the device 100 so that a larger number of erasure blocks 112 are provided in the array as compared to the specified total data capacity of the device. For example, a storage device rated at 2 terabytes, TB ($2 \times 10^{12}$ bytes) of user data storage capacity may have a greater amount of total capacity, such as 4 TB, but may only report the lower capacity value to the user. The provisioning of "extra" blocks enhances the ability of the device 100 to carry out garbage collection and wear leveling operations to maintain performance levels and operational life of the device.

Figure 4:
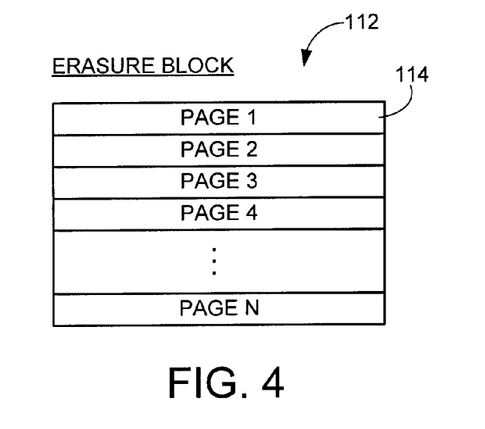
FIG. 4 illustrates a format for an erasure block.

FIG. 4 shows an exemplary format for one of the erasure blocks 112 in FIG. 3. In FIG. 4, the erasure block 112 is arranged as a plurality of pages 114 of memory. An exemplary page size can be on the order of about 4 KB-8 KB. Data are written to the pages in turn and are separately addressable. Appropriate metadata may be generated and stored in the erasure block, or elsewhere in the system, to track the locations of data written to the respective pages. Each time a new version of a set of data associated with a particular logical address (such as a logical block address, LBA) is written to the array, the new version can be written to a new page 114 in the most recently allocated erasure block 112.

Figure 5:
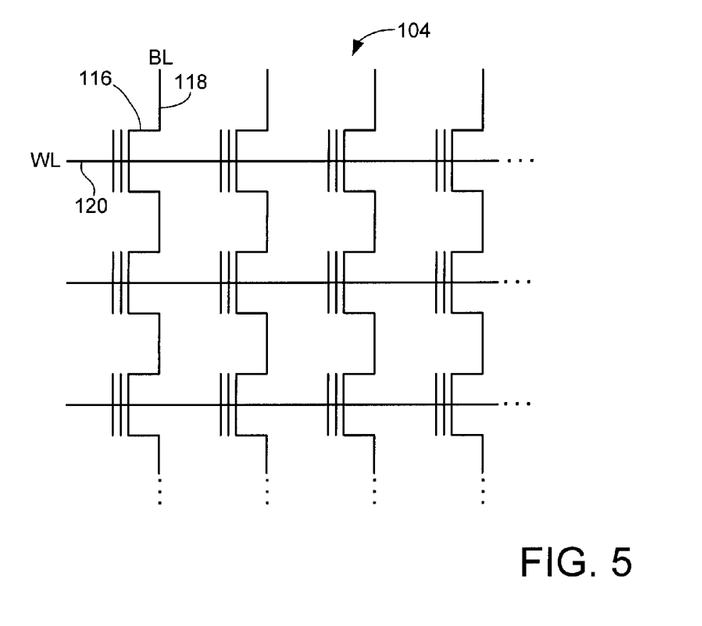
FIG. 5 is a schematic representation of the memory in accordance with some embodiments.

FIG. 5 is a schematic representation of individual flash memory cells 116 arranged into rows and columns to form the page and block structures of FIGS. 4-5. The memory cells are accessed by an arrangement of control lines, such as bit lines (BL) 118 and word lines (WL) 120. In some embodiments, all of the flash memory cells 116 along a selected row (e.g., coupled to a common word line 120) may form a separate page 114 of memory.

Figure 6:
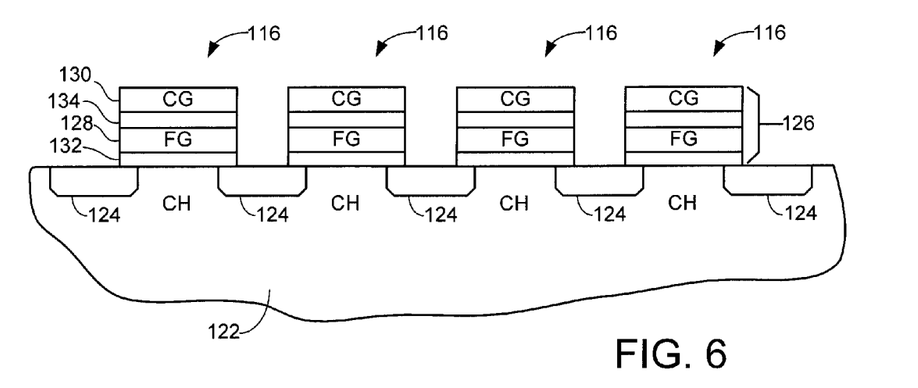
FIG. 6 is an elevational cross-sectional view of memory cells from FIG. 5.

FIG. 6 illustrates a plurality of exemplary flash memory cells 116 from FIG. 5. Each of the memory cells 116 is formed on a semiconductor substrate 122 having spaced apart n+ doped regions 124. A gate structure 126 spans each pair of adjacent doped regions 124 so that each flash cell 116 takes a general nMOS transistor configuration. A series of adjacent flash cells can be formed in a NAND configuration as shown with a separate gate structure 124 spanning each adjacent pair of doped regions 110.

Each gate structure 126 provides an alternating stack of electrically conductive gates 128, 130 and electrically insulative regions 132, 134. Data are stored by each cell 116 in relation to the relative amount of electrical charge stored on the lower gate 128, which is characterized as a floating gate (FG).

The floating gate 128 accumulates charge during a programming operation by the selected application of appropriate voltages to the adjacent doped (drain and source) regions 124 and the upper gate 130, characterized as a control gate (CG). These applied voltages induce the controlled migration of electrical charge from a channel (CH) portion of the semiconductor substrate 122 to the floating gate 128 across the lower insulative region 132.

In an initial erased state, there will be little (substantially no) accumulated charge on the floating gate 128. In this state, the cell will generally exhibit drain-source conductivity across the channel CH without the application of voltage to the control gate 130. Once charge has been accumulated on the floating gate 128, the drain-source path will be non-conductive unless a sufficiently high gate control voltage is applied to the control gate 130, at which point the cell becomes conductive. The programmed state of the cell 116 can thus be determined by observing the level of control gate voltage required to allow drain-source current to pass through the cell 116, which generally correlates to the amount of accumulated charge on the floating gate 128.

The cells 116 can be configured as single-level cells (SLCs) or multi-level cell (MLCs). An SLC flash cell stores a single bit; a normal convention is to assign the logical bit value of 1 to an erased cell (substantially no accumulated charge) and a logical bit value of 0 to a programmed cell (presence of accumulated charge). An MLC flash memory cell stores multiple bits, such as two bits. Generally, n bits can be stored using $2^n$ storage states.

A normal convention is to assign the multi-bit logical value 11 to an erased cell with charge C0 (substantially no accumulated charge), and then sequentially assign the remaining multi-bit logical values 10, 01 and 00 to increasingly higher charge levels C1, C2 and C3 where C0<C1<C2<C3. In some cases, Grey code techniques can be utilized so that only a single bit changes with each increased charge state: for example, the sequence of charge levels C0, C1, C2 and C3 may be used to represent the respective storage states of 11, 10, 00 and 01. Other encoding techniques can be employed as desired. For reference, the charge level C3 represents the largest amount of charge that can be provided to the floating gate while the cell remains in a normally programmed state.

A special erasure operation is generally required to remove accumulated charge from the floating gate 128 in each cell. The erasure operation is carried out on an erasure block basis (see 112, FIGS. 3-4), or on a garbage collection unit (GCU) basis where a GCU is defined as a grouping of erasure blocks 112 that are allocated and erased as a unit.

An erasure can be carried by the application of a relatively high voltage to the memory cell (such as on the order of, e.g., 15-20V) to cause migration of the charge from the floating gate 128 back to the channel region. A different combination of voltages may be applied to the cell 116 to thereafter add charge to the floating gate 128 during a data write (programming) operation.

As noted above, the memory cells 116 can be arranged in the memory module 104 as an array of rows and columns of the memory cells, as previously depicted in FIG. 5. Each column of cells is coupled to a respective bit line (BL) 118 so that the bit line currents pass through the respective drain-source channel regions of the cells. The control gates 130 of the cells 116 along each row can be interconnected to the respective word lines (WL) 120.

Block-level wear leveling may be employed by the controller 102 to track the erase and write status of the various erasure blocks 112 (FIGS. 3-4). New blocks will be allocated for use as required to accommodate newly received data. In at least some embodiments, a full page worth of data is written to each page 114 (FIG. 4) at a time. Multiple user data sectors of data (each having an associated logical address, such as an LBA value) may be written to the same page, and a given LBA's worth of data may be physically stored so as to span multiple pages. Filler bits may be appended to a selected set of input data if a full page worth of data is not supplied for writing in a given write operation. Error correction codes such as parity bits may be incorporated at the page level to correct errors as a full page worth of data is retrieved. Metadata and other control information may be stored in each erasure block 112, or stored elsewhere such as in specific blocks dedicated to this purpose.

If data for a particular LBA are presently stored in a first page (with a first physical address) and the device 100 receives a write command to write new, updated data for that LBA, the controller 102 may select a second, new page (with a different physical address) to store the updated data and mark the LBA data in the first page as old data. When all of the data in a page are superseded, the page is marked for erasure. When enough pages in a given block are marked for erasure, a garbage collection operation may be scheduled in the background to copy current version data to a new block and to erase the existing block.

Figure 7A:
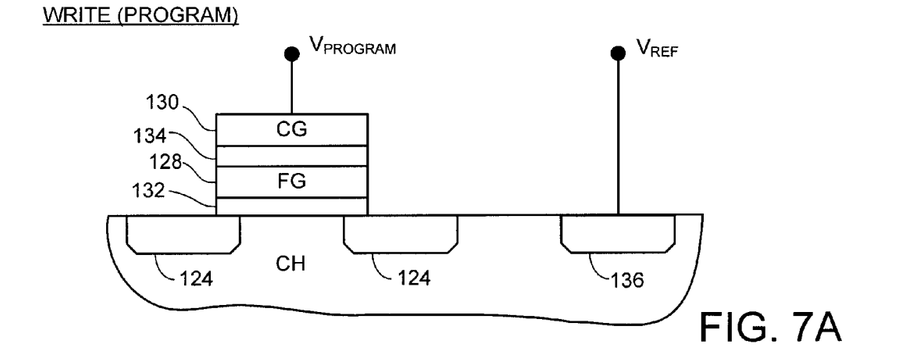
FIGS. 7A-7C are schematic representations of various voltages applied to a selected memory cell during write, read and erase operations.
Figure 7B:
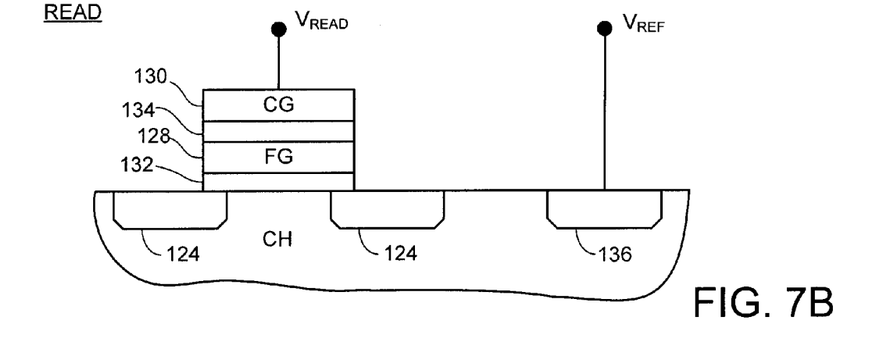
Figure 7C:
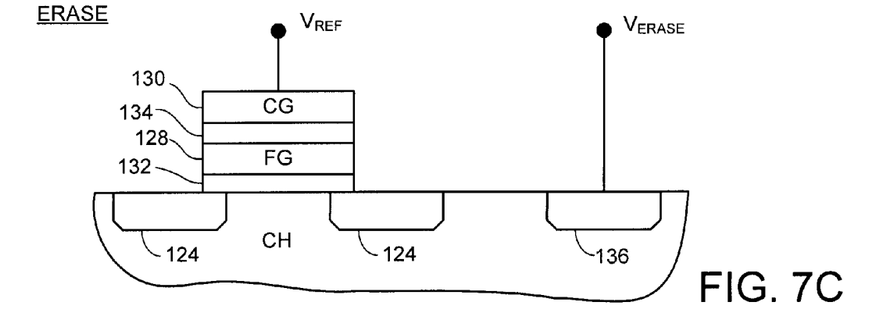

FIGS. 7A-7C show respective voltage combinations that can be applied to carry out respective write (programming), read and erase operations on a selected memory cell 116. For purposes of clarity, it will be contemplated that the cell is configured as an MLC, although such is merely illustrative.

To write a selected programmed state, as shown in FIG. 7A a relatively large programming voltage $V_{PROGRAM}$ (such as around 20V) is applied to the control gate 130, and the substrate 122 is provided with a suitable reference voltage $V_{REF}$ (such as electrical ground). The substrate voltage can be controlled through the use of an n+ doped terminal region 136, or some other suitable arrangement. While not shown, it will be appreciated that other various select devices (such as column select transistors) and control lines (e.g., non-selected word lines and bit lines) in the array may be configured in order to isolate the application of the programming effort to the selected cell.

During the programming operation, charge is migrated from the channel region (CH) to the floating gate 128. In some embodiments, the programming voltage is applied as a sequence of pulses, with periodic read operations upon the cell to determine if the desired programmed state has been achieved (e.g., C1, C2, C3). Once the cell has been correctly programmed, the programming process is concluded.

FIG. 7B shows the memory cell 116 during a subsequent read operation. As before, the appropriate column select devices and other non-selected control lines are set at appropriate values to isolate the cell. The substrate 122 is placed at the reference voltage $V_{REF}$ and a sequence of sense voltage $V_{READ}$ are applied to the control gate. Different sequences of sense voltages will be applied depending on whether the cell is configured as an SLC or an MLC. Generally, the charge state is sensed in relation to the magnitude of sense voltage required to place the cell in a conductive drain-source state.

FIG. 7C shows the memory cell 116 during a normal erase operation. The erase operation serves to remove substantially all of the accumulated charge (if any) from the floating gate 128. Appropriate select circuitry and control line voltages are asserted so that all of the memory cells in a selected erasure block are concurrently subjected to the erasure voltages. An appropriate erase voltage $V_{ERASE}$ is applied to the substrate 122, and the control gate 130 is placed at the reference voltage $V_{REF}$. The magnetic effects proximate the channel region will tend to migrate the charge on the floating gate to the channel.

As will be appreciated, applying an erasure operation as set forth in FIG. 7C to purge the contents of the entire memory 104 may be time and power consuming. For example, a 1 terabyte, TB SSD with an average erasure time (tBER) of 5 milliseconds, ms, may require upwards of about 3 hours to complete the erasure of every erasure block in the device. Such operation could be shortened by erasing multiple blocks in parallel if sufficient power is available, but this still could take an undesirably long time to complete.

Figure 8:
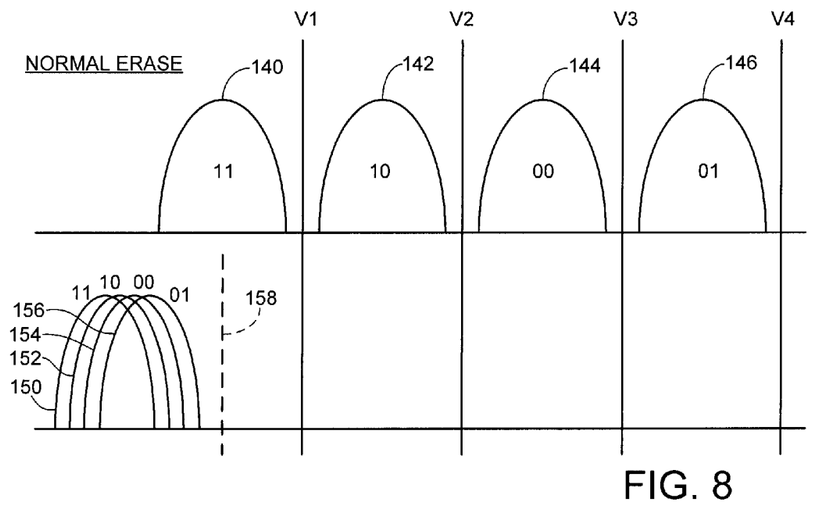
FIG. 8 graphically illustrates program distributions of memory cells such as in FIGS. 5-7.

Moreover, a limitation associated with a standard erasure operation is the fact that there may be forensic information in the form of a data signature in the memory cells after erasure. For example, a cell that was erased from a relatively higher charge state (e.g., C3) may have a final erased charge (voltage) level on the floating gate as compared to a cell that was erased from a relatively lower charge state (e.g., C1). FIG. 8 depicts this exemplary situation.

In FIG. 8, four different distributions 140, 142, 144 and 146 are shown to represent different groupings of memory cells 116 that were stored with different charge levels using the programming sequence of FIG. 7A. More specifically, distribution 140 represents a first population of cells that were programmed to the initial C0 (logical 11) state. Distribution 142 represents a second population of cells programmed to charge state C1 (logical state 10), and so on. The populations are shown to be substantially Gaussian, but this is merely illustrative; the actual distribution characteristics may depend on a variety of factors and can thus take a variety of different forms.

Respective sense voltages are denoted in FIG. 8 as V1-V4 where V1<V2<V3<V4. These voltages can correspond to the sequence of read voltages VREAD from FIG. 7B. In some embodiments, the state of a given programmed cell can be read by applying voltage V2 to the control gate 130 of the selected cell. If the cell is rendered conductive across the channel region, it is then known that the programmed state is either 11 or 10. Subsequent application of V1 will determine the programmed state of the cell. For example, if V1 rendered the cell conductive, the programmed state is 11; if V1 did not render the cell conductive, the programmed state is 10. Similarly, if the voltage V2 does not place the cell in a conductive state, then application of voltage V3 will determine whether the cell is programmed as 00 or 01.

It is noted that the maximum available read sense voltage V4 will generally result in all of the programmed cells being rendered in a conductive state irrespective of the programmed state of the respective cells. That is, no matter whether a given cell is programmed as 11, 10, 00 or 01, the cell will generally be rendered conductive responsive to application of the voltage V4.

Application of an erasure voltage to the associated control gates 130 can generally result in four corresponding distributions of charges 150, 152, 154 and 156 in FIG. 8. Each of these distributions are below an erased threshold voltage (denoted by broken line 158). The erased threshold voltage 158 can be applied to ensure that the cells have been sufficiently erased and are ready for the storage of new programmed data.

While all of the distributions 150-156 are below the threshold voltage 158, the differences among the distributions 150-156 may be quantifiable by a third party attacker as a program signature of the cells, allowing the attacker to determine what data were previously stored on the cells.

Accordingly, the exemplary device 100 is configured to carry out special data sanitizing processing to quickly purge data from the entire memory 104 (or a selected portion thereof) in such a way as to reduce quantifiable signatures of residual charge such as shown at 150-156 in FIG. 8. As explained below, a fast program operation and, as desired, a fast erase operation can be employed to sanitize data from the array.

Figure 9:
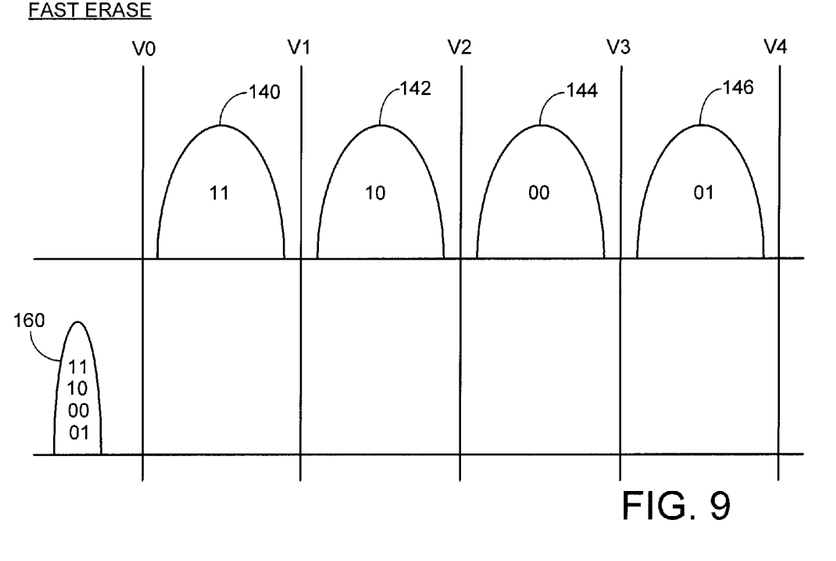
FIG. 9 illustrates a fast erase process in accordance with some embodiments.

FIG. 9 shows an exemplary fast erase operation. Distributions 140-146 from FIG. 8 are displayed for purposes of clarity. The fast erase operation is operable to substantially provide all of the memory cells 116 in the array with substantially the same common residual distribution 160.

In some embodiments, the fast erase processing generally involves selecting all of the pages 114 in all of the erasure blocks 112 in the array 104 and applying suitable erasure voltages to the cells. During the fast erase of the memory cells, a relatively large voltage is applied to the substrate 122, and the reference voltage is applied to the control gates of the affected cells. Due to the relatively large power requirements of such operation, the required power may be supplied from a special internal power supply configured for this purpose (such as, e.g., the backup power module 110 in FIG. 2). Alternatively, the host device may be configured to transfer the requisite power to the storage device 100, or existing power circuitry within the device 100 may be configured to have sufficient capacity for this special operation.

In the fast erase processing of FIG. 9, open loop processing may be applied with longer duration (or continuous) pulsing of the erase voltage without necessarily using feedback sensing as in the case with normal erasures (see FIG. 7C).

In some embodiments, a timer circuit may be used to maintain the application of the erasure voltages for a predetermined period of time (e.g., X seconds), after which the erasure processing is completed. In other embodiments, the longer duration pulses may be applied for a selected period of time, after which some (or all) of the cells are sensed to determine whether sufficient erasure processing has been applied (e.g., by the application of a voltage threshold such as 158).

It will be noted that FIG. 9 includes an additional read sense voltage V0. This represents a minimum available read sense voltage that can be applied to read the memory cells. This voltage V0 is lower than the erase verify voltage (line 158) in FIG. 8, and may be insufficient to turn on (place in a conductive state) any of the cells programmed to the 11 logic level.

One difference between this fast erase processing and normal erase processing is that normal erase processing is usually applied in such a way as to ensure that the cells can remain operative at the conclusion of the erase operation. That is, normal erasures (such as in FIG. 7C) are carefully tailored to ensure that the accumulated charge on the floating gates migrates back to the substrate 122 without inducing damage to the cell structure. By contrast, the fast erase processing as disclosed herein may specifically induce damage to the cells as the accumulated charge is quickly driven to the substrate channel.

In some embodiments, the fast erase processing uses the same voltage level applied to the substrate 122 as in a normal erasure (e.g., 15-20V). However, in other embodiments a larger voltage level may be applied to the substrate (e.g., 25V or more). In further embodiments, a constant maximum voltage available from the associated supply is applied instead of ramping this voltage up as can be performed during normal erase processing. As noted above, the fast erase processing achieves a tighter distribution of final charge states on the floating gates (e.g., distribution 160) as compared to normal erasures (e.g., distributions 150-156).

Figure 10:
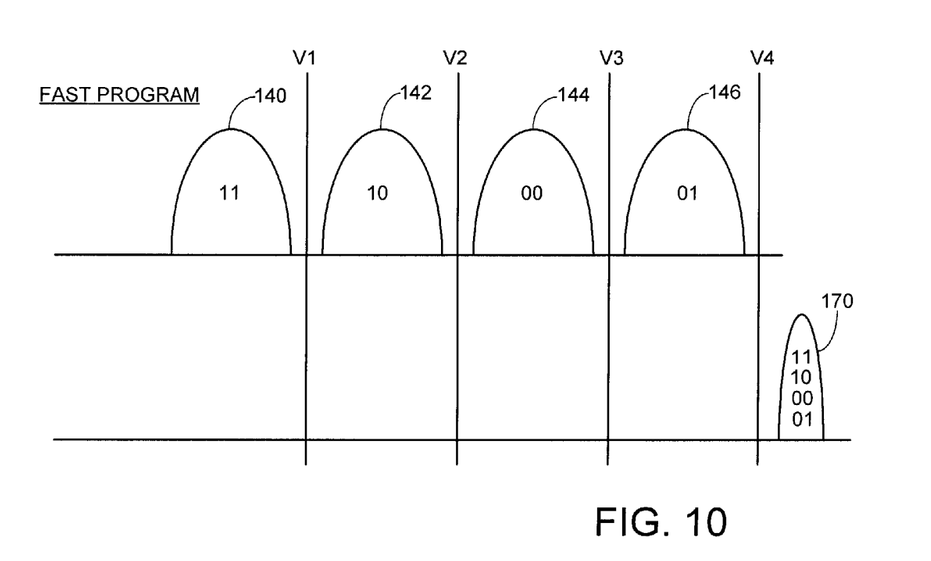
FIG. 10 shows a fast program process in accordance with some embodiments.

FIG. 10 shows the aforementioned fast program process in accordance with various embodiments. Unlike the fast erase process which substantially removes all of the accumulated charge from the affected cells, the fast program process is generally adapted to accumulate a significantly greater amount of charge onto the cells than is obtained during normal programming operations. That is, as shown by distribution 170 in FIG. 10, the amount of charge on the floating gates 128 is substantially greater than the amount of charge in distribution 146. Moreover, the distribution may be tightly controlled and substantially the same irrespective of the initial programmed state.

In some embodiments, the total amount of charge on the respective floating gates 128 may be higher than the maximum available read sensing voltage that can be applied to the cells, such as represented by voltage V4 in FIG. 10. In such case, none of the cells can be rendered into a conductive state. This reduces the ability of an attacker to quantify the amount of charge that was previously stored on the floating gate.

While it is contemplated that the cells will be able to retain this maximum amount of accumulated charge without incurring damage, it is nevertheless possible that an avalanche breakdown of the insulative layer 132 may occur for some cells, thereby resulting in a large transfer of charge to the substrate. This is not considered to be a problem, as forensic examination of a damaged cell may yield inconclusive results as to prior programmed states.

Another feature of the fast program processing as depicted in FIG. 10 is that, if the fast program processing is immediately followed by the fast erase processing of FIG. 9, a large amount of charge (distribution 170) may be quickly transferred to the substrate, further enhancing the possibility that some, if not all, of the cells will incur damage. This breaking forth of charge may be considered analogous to releasing a large amount of pent up water from a dam all at once. Such flooding, or avalanche, condition, may result in damage to the cells. Even if not damaged, the higher charge state may serve to mask the previous stored programmed state.

Figure 11:
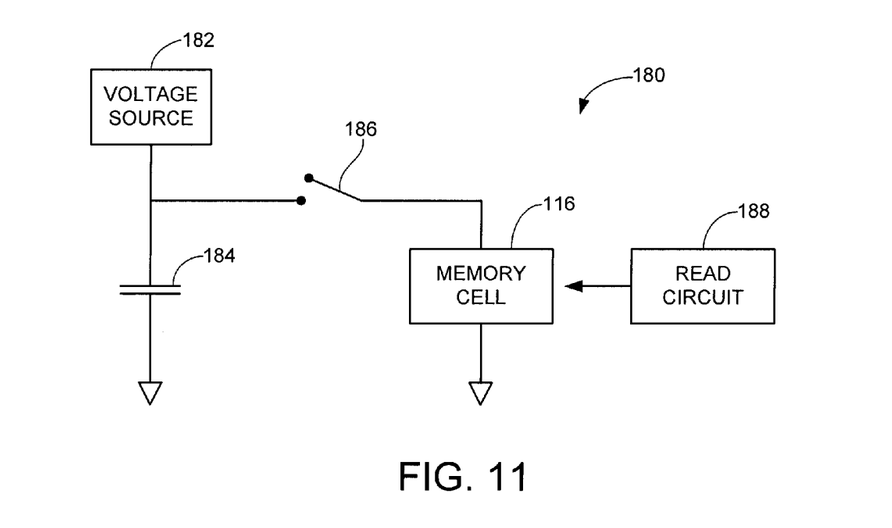
FIG. 11 is a circuit that can be used in the fast program process of FIG. 10.

FIG. 11 shows a control circuit 180 that can be used during the fast erase processing of FIG. 9 and the fast program processing of FIG. 10. In some embodiments, the same circuit can further be used during the normal write, read and normal erasure programming of FIGS. 7A-7C. It will be appreciated that any variety of control circuits can be employed, including circuits that employ charge pumping, filtering, clocking, etc., so the exemplary circuit 180 is merely for purposes of illustration and is not limiting.

Generally, FIG. 11 includes a voltage source 182 which supplies a voltage to a capacitor 184 or other storage element. A selectively activated switch 186, which may take the form of a power MOSFET or other suitable device, periodically closes to allow the transfer of accumulated charge from the capacitor 184 to the selected memory cell 116. It will be appreciated that during a fast erase, the accumulated charge may be transferred to the substrate 122, and during a fast program, the accumulated charge may be transferred to the control gate 130 of the cell.

As required, a read circuit (denoted by block 188) can be used to periodically apply read voltages to the cell, such as but not limited to a lower erase voltage such as 158 in FIG. 9 or an upper read threshold voltage such as V4 in FIG. 10. Periodic read sensing operations can be performed during these respective fast erase/program processing to assess progress of the operation. For example, the fast programming of FIG. 10 can involve use of the circuit of FIG. 11 until all of the cells (or a portion thereof) cannot be rendered conductive responsive to application of the maximum available read sense voltage V4. Similarly, the fast erasure of FIG. 9 can involve use of the circuit of FIG. 11 until all of the cells (or a portion thereof) are rendered conductive responsive to application of the minimum available read sense voltage V0.

In some embodiments, the fast program processing can be configured such that the circuit 180 continues to apply charge until the cell 116 is rendered permanently damaged due to an avalanche breakdown of the accumulated charge on the floating gate back to the substrate. In other embodiments, the circuit 180 continues to operate for a preselected time interval empirically determined to be sufficient to ensure all cells, irrespective of the initial programming states, achieve the desired final charge distribution.

In still further embodiments, different amounts of programming may be applied to different cells until all of the cells affected by the processing are found to have been rendered nonconductive. In still further embodiments, all of the effected cells are programmed to a common state prior to application of the fast programming or fast erase operation. For example, a first "normal" programming operation may take place to program all of the affected cells to a first state (e.g., state 01 in FIG. 10), after which the fast programming is applied.

Figure 12:
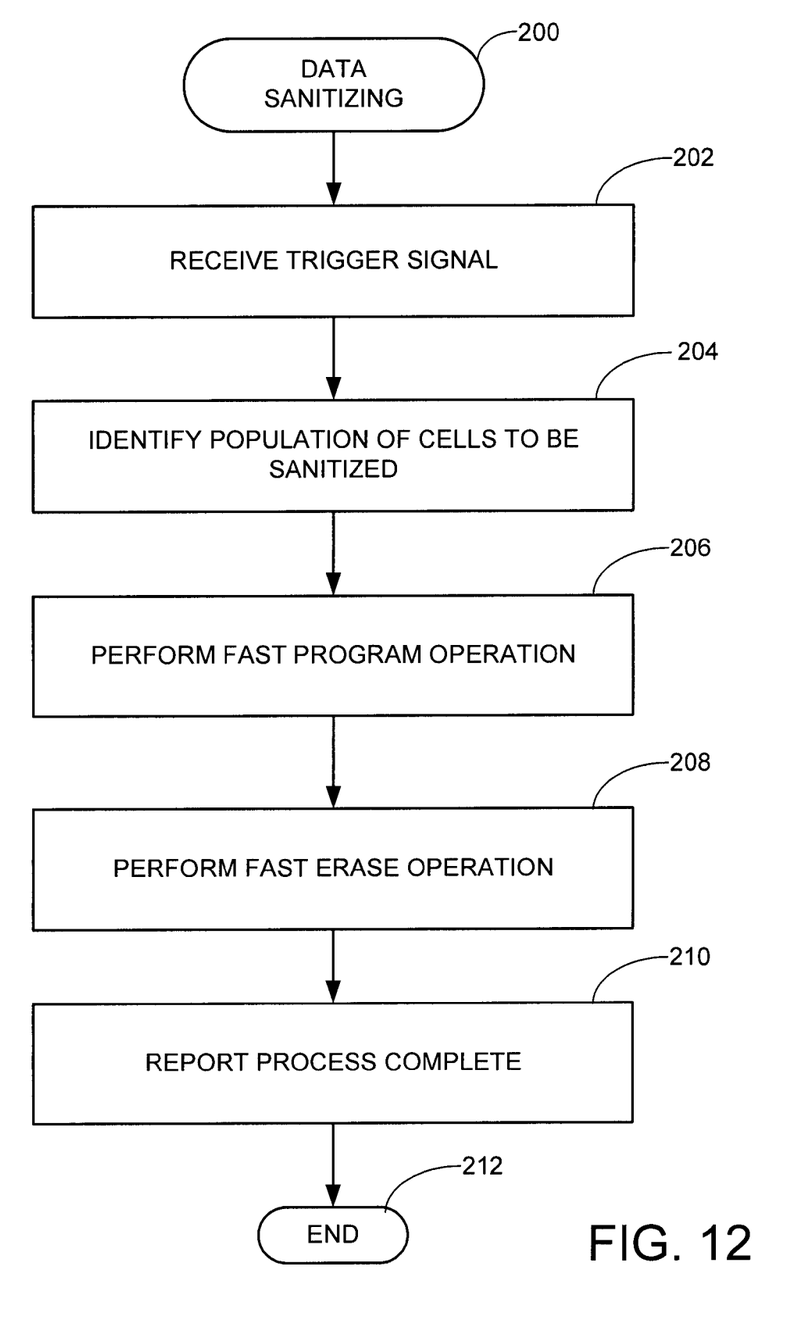
FIG. 12 is a flow chart for a DATA SANITIZING routine carried out in accordance with various embodiments.

FIG. 12 shows a flow chart for a DATA SANITIZING routine 200 generally illustrative of various steps that may be carried out in accordance with the foregoing discussion. It will be appreciated that various steps can be omitted, modified, appended, or performed in an order that is different from that shown. While not limiting, it is contemplated that the routine may be carried out by a suitable control circuit such as the controller 102 in FIGS. 1-2.

As shown by step 202, the data sanitizing operation may commence responsive to receipt of a trigger signal. This trigger signal can be internally or externally generated. For example, the host device may forward a specially configured signal to the storage device 100 to begin the data sanitizing process. The external trigger signal may, as desired, identify a range of LBAs to be sanitized from the device, or may be a simple signal that causes the device to sanitize the entire array (or a predetermined section thereof).

Additionally or alternatively, the trigger signal that commences the data sanitizing operation may be internally generated responsive to the detection of some triggering event, such as but not limited to an unauthorized power down event, the timeout of an internal dead man's switch type circuit, loss of host I/O communications, and so on.

Once the data sanitizing operation has been triggered, the device 100 continues at step 204 to identify a population of memory cells to which the data sanitizing operation is to be applied. As noted above, all of the cells in the memory array 104 may be concurrently sanitized, or some selected subportion of the cells may be subjected to the data sanitizing operation. In some embodiments, if a partial sanitizing operation is employed, garbage collection operations may be carried out to relocate data intended to be retained by the memory.

The exemplary process continues at step 206 where fast program processing is applied as discussed above in FIG. 10 to the population of cells identified in step 204. In at least some embodiments, fast erase processing is subsequently applied to these cells at step 208, as discussed above in FIG. 9. It will be appreciated that both fast program and fast erase processing need not necessarily be applied to every cell. For example the cells may only be subjected to fast program processing. Alternatively, a first group of cells receive one type of processing and a different group of cells may receive another type of processing.

As desired, steps 206 and/or 208 can be repeated a number of times in succession. In some embodiments, an intermediary write operation (e.g., FIG. 7A) can be performed to write data (e.g., random data, bit inverted data, etc.) to the cells between these respective processing steps. For example, it may be useful to first write all of the affected cells to the C3 level (logical 01) prior to the fast program processing so that the fast program processing starts with a common baseline.

Once the data sanitizing operation has been completed, the device 100 may be configured to report a process complete status to the host, as shown by step 210, after which the routine ends at step 212.

The various techniques disclosed herein may provide a number of benefits, including reduced power consumption, shorter time implementation and greater levels of signature wiping over conventional approaches. The fast program and fast erase operations disclosed herein can be adapted to a wide variety of memories and applications, and are not necessarily limited to any particular style or type of memory. It is contemplated that a special "purge" command may be implemented in a command set for a particular interface or host/storage device combination so that, responsive to the purge command, the storage device operates as described herein to sanitize the memory. In some embodiments, the data sanitizing carried out herein may be directed to all copies of a particular extended data set (e.g., various copies and versions of data sharing a common logical address, e.g., a particular range of LBAs, etc.).

It will be appreciated that the processing disclosed herein can be applied to any type of data. For example, a hierarchical approach may be employed such that extremely sensitive data are subjected to the data sanitizing processing first, followed by, if available time and power permit, the sanitizing of other cells in the array. In some embodiments, some types of data, such as encryption keys, are sanitized first and/or experience greater amounts of data sanitizing. For example, it is contemplated that all of the cells storing encryption keys may be processed so that these are confirmed as being physically damaged.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising programming a memory cell by using a write circuit to accumulate charge on a floating gate of the cell to a selected one of a plurality of states, the plurality of states comprising a state representing the largest amount of charge that can be provided to the floating gate while the cell remains in a normally programmed state, and subsequently sanitizing the memory cell by using the write circuit to accumulate additional charge on the floating gate of the cell to a level greater than said largest amount of charge such that application of a maximum available read sensing voltage to a control gate of the cell is insufficient to place the cell in a conductive state.

2. The method of claim 1, further comprising reading the programmed state of the cell by application of a second read sensing voltage less than the maximum available read sensing voltage prior to the sanitizing step.

3. The method of claim 1, in which the memory cell is incorporated into a memory array of cells, and the sanitizing step is concurrently applied to all said cells in the memory array.

4. The method of claim 1, in which the memory cell is incorporated into a memory array of cells, and the sanitizing step is concurrently applied to a plurality of said cells less than all of said cells in the memory array.

5. The method of claim 1, in which the sanitizing step further comprises subsequently using an erase circuit to remove accumulated charge from the floating gate of the cell.

6. The method of claim 5, in which the erase circuit removes the accumulated charge at a rate sufficient to damage the cell.

7. The method of claim 1, in which the sanitizing step further comprises continuing to accumulate charge on the floating gate until the cell is damaged through an avalanche breakdown condition.

8. The method of claim 1, in which the sanitizing step is concurrently performed upon a plurality of memory cells in a memory array, and the method further comprises programming each of said plurality of memory cells to a common selected one of the plurality of states prior to the sanitizing step.

9. The method of claim 1, in which the memory cell is characterized as a flash memory cell in a flash memory array comprising a plurality of flash memory cells arranged in a NAND configuration.

10. The method of claim 1, in which the sanitizing step is performed responsive to detection of a trigger signal.

11. The method of claim 1, in which the plurality of states further comprises a state representing a smallest amount of charge that can be provided to the floating gate while the cell remains in a normally erased state, and the sanitizing step further comprises subsequently removing the accumulated charge from the floating gate of the memory cell to a level less than said smallest amount of charge such that application of a minimum available read sensing voltage to the control gate of the cell is sufficient to place the cell in a conductive state.

12. An apparatus comprising:
a non-volatile memory comprising an array of memory cells; and
a control circuit adapted to sanitize the memory by directing a write circuit to accumulate charge on a floating gate of a selected memory cell to a level such that application of a maximum available read sensing voltage to a control gate of the cell is insufficient to place the cell in a conductive state, the control circuit comprising a voltage source and a capacitor which selectively applies voltage to a substrate of the memory to induce the accumulation of the charge on the floating gate.

13. The apparatus of claim 12, in which the memory is characterized as a flash memory array comprising a plurality of flash memory cells arranged in a NAND configuration.

14. The apparatus of claim 12, further comprising a read/write/erase circuit utilized by the control circuit during said data sanitizing operation.

15. The apparatus of claim 12, in which the control circuit directs a concurrent data sanitizing operation upon all of the memory cells in the memory.

16. The apparatus of claim 12, in which the control circuit further sanitizes the selected memory cell by subsequently directing an erase circuit to reduce the accumulated charge from the floating gate of the selected memory cell to a level less than an amount of accumulated charge on the floating gate resulting from a normal erase operation.

17. A data storage device, comprising:
a non-volatile memory comprising an array of memory cells;
a read/write/erase circuit coupled to the memory; and
a controller adapted to direct a transfer of data between the memory and a host device using the read/write/erase circuit during normal read and write operations, the controller further adapted to perform a special data sanitizing operation to sanitize the memory by directing the read/write/erase circuit to accumulate charge on a floating gate of a selected memory cell to a level such that application of a maximum available read sensing voltage to a control gate of the cell by said read/write/erase circuit is insufficient to place the cell in a conductive state, wherein charge continues to be accumulated on the floating gate during the special data sanitizing operation until the selected memory cell is damaged through an avalanche breakdown condition.

18. The data storage device of claim 17, further comprising a backup power module which supplies power to the read/write/erase circuit during said data sanitizing operation.

19. A method comprising:
programming each of a plurality of memory cells in a memory array to a common programming state by using a write circuit to accumulate charge on a floating gate of each cell to a common nominal level; and
sanitizing the plurality of memory cells by using the write circuit to further accumulate charge on the floating gate of each cell to a level such that application of a maximum available read sensing voltage to a control gate of the cell is insufficient to place the cell in a conductive state.

20. The method of claim 19, further comprising a prior step of initially programming each of the plurality of memory cells to a different programming state by using the write circuit to accumulate charge on the floating gate of each cell to a different nominal level, wherein the programming of the plurality of memory cells to the common programming state is subsequently carried out by adding charge to at least some of the plurality of memory cells without an intervening erase operation.

* * * * *